United States Patent
Leung

(10) Patent No.: US 9,767,914 B1
(45) Date of Patent: Sep. 19, 2017

(54) DURABLE MAINTENANCE OF MEMORY CELL ELECTRIC CURRENT SENSE WINDOW FOLLOWING PROGRAM-ERASE OPERATIONS TO A NON-VOLATILE MEMORY

(71) Applicant: Wingyu Leung, Cupertino, CA (US)

(72) Inventor: Wingyu Leung, Cupertino, CA (US)

( * ) Notice: Subject to any disclaimer, the term of this patent is extended or adjusted under 35 U.S.C. 154(b) by 0 days.

(21) Appl. No.: 15/289,235

(22) Filed: Oct. 10, 2016

(51) Int. Cl.
| G11C 16/04 | (2006.01) |
| G11C 16/34 | (2006.01) |
| G11C 16/10 | (2006.01) |
| G11C 16/16 | (2006.01) |
| G11C 16/26 | (2006.01) |
| G11C 16/08 | (2006.01) |

(52) U.S. Cl.
CPC .......... *G11C 16/3431* (2013.01); *G11C 16/08* (2013.01); *G11C 16/10* (2013.01); *G11C 16/16* (2013.01); *G11C 16/26* (2013.01)

(58) Field of Classification Search
USPC ............. 365/185.28, 185.29, 185.18, 185.22
See application file for complete search history.

(56) References Cited

U.S. PATENT DOCUMENTS

| 4,396,844 | A | 8/1983 | Miller et al. |
| 4,695,946 | A | 9/1987 | Andreasen et al. |
| 4,701,845 | A | 10/1987 | Andreasen et al. |
| 5,619,066 | A | 4/1997 | Curry et al. |
| 5,798,961 | A | 8/1998 | Heyden et al. |
| 6,507,523 | B2 | 1/2003 | Pekny |
| 7,619,922 | B2 | 11/2009 | Li et al. |
| 8,040,744 | B2 | 10/2011 | Gorobets et al. |
| 8,117,367 | B2 | 2/2012 | Conti et al. |
| 2006/0221696 | A1 | 10/2006 | Li |
| 2007/0211537 | A1* | 9/2007 | Park .................... G11C 16/0483  365/185.22 |
| 2007/0263455 | A1 | 11/2007 | Cornwell et al. |
| 2011/0179322 | A1* | 7/2011 | Lee ..................... G06F 11/1048  714/719 |

* cited by examiner

*Primary Examiner* — Vu Le
(74) *Attorney, Agent, or Firm* — Raj Abhyanker, P.C.

(57) ABSTRACT

A method of a state machine executing instructions related to program-erase operations performed on a non-volatile memory is disclosed. The method includes implementing a program-erase loop counter in the state machine, and presetting a threshold for an electric current of memory cells and a step time for each of the program and the erase operation. Based on repeatedly executing a number of comparison and verification operations, each for a duration of the preset step time until the program-erase loop counter reaches a maximum value thereof, the electric current of the each programmed-erased memory cell is maintained at a desired level thereof following termination of the each of the program and the erase operation.

21 Claims, 16 Drawing Sheets

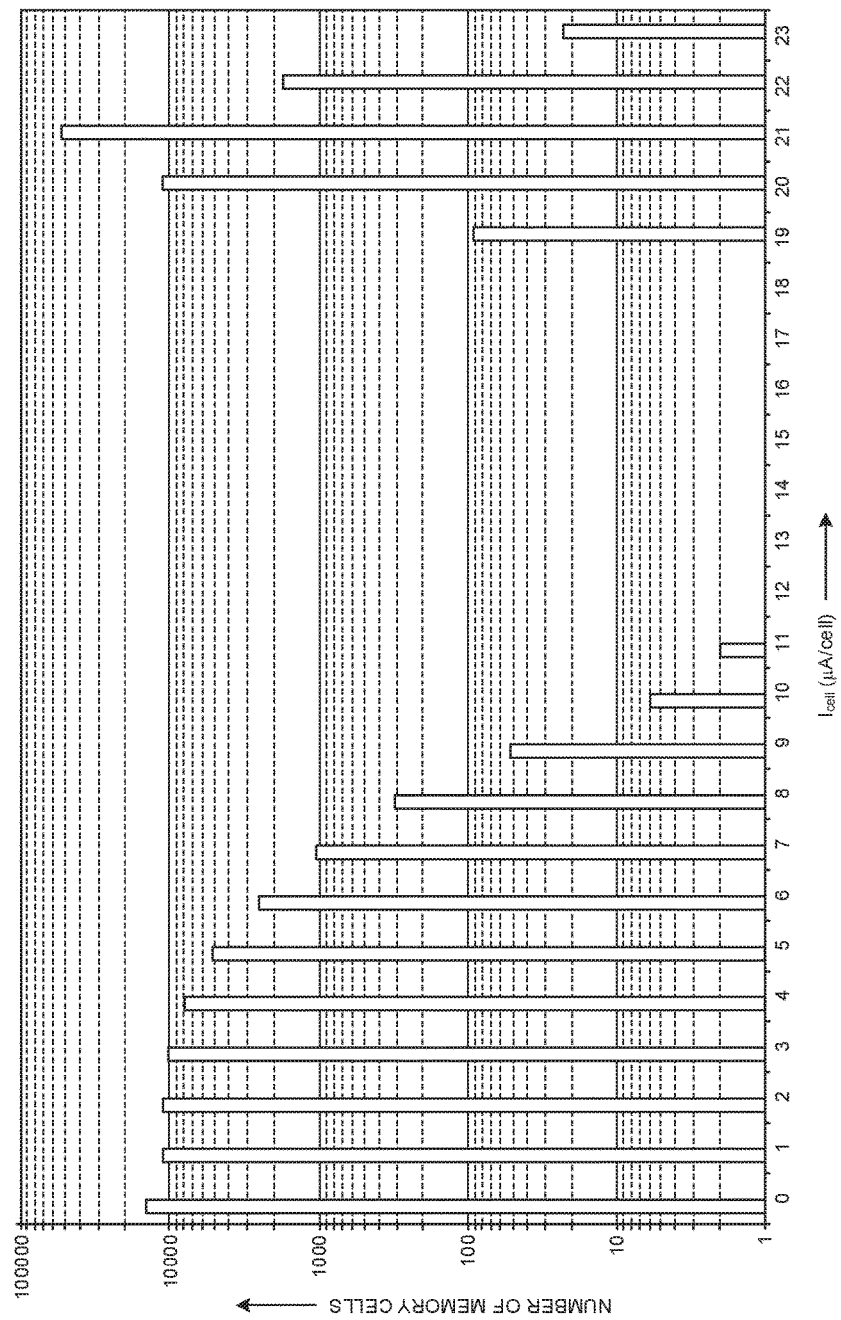

DURABLE MAINTENANCE OF MEMORY CELL ELECTRIC CURRENT SENSE WINDOW FOLLOWING PROGRAM-ERASE OPERATIONS TO A NON-VOLATILE MEMORY

FIELD OF TECHNOLOGY

This disclosure relates generally to non-volatile memories and, more particularly, to durable maintenance of a memory cell electric current sense window following program-erase operations to a non-volatile memory.

BACKGROUND

A non-volatile memory cell may have a higher electric current during a program state thereof than that during an erase state thereof. The difference in electric cell currents during these states may correspond to a maximum sense window within which the program state can be distinguished from the erase state by a sense amplifier utilized as part of memory circuitry including the non-volatile memory cell. The electric current of the non-volatile memory cell may be a function of factors associated with the memory circuitry such as data retention time, endurance, signal noise and sense amplifier offset. This may lead to an actual sense window being smaller than a width of the maximum sense window.

SUMMARY

Disclosed are a method, a device and/or a system of durable maintenance of a memory cell electric current sense window following program-erase operations to a non-volatile memory.

In one aspect, a method of a state machine configured to execute a sequence of instructions therethrough related to a program operation performed on a non-volatile memory is disclosed. The method includes implementing a program loop counter in the state machine, presetting a threshold for an electric current of memory cells of the non-volatile memory, a step time and a maximum value of the implemented program loop counter, and resetting the implemented program loop counter.

The method also includes programming the non-volatile memory at each memory location of an intended set of memory locations, which, in turn, includes reading data from the each memory location based on addressing thereof, determining that the read data from the each memory location addressed does not match data to be programmed thereto, generating a program pulse to program the non-volatile memory at the each memory location addressed for the preset step time following the determination of the mismatch between the read data and the data to be programmed, and incrementing the program loop counter following the generation of the program pulse related to the programming of the each memory location addressed.

Further, the method includes determining that the incremented program loop counter reaches the preset maximum value thereof, terminating the program operation on the non-volatile memory based on the determination that the program loop counter has reached the preset maximum value thereof, and maintaining, following the termination of the program operation, the electric current of the each programmed memory cell of the non-volatile memory at a level higher than the preset threshold based on the program loop counter implementation in conjunction with the preset step time of programming the each memory location addressed and the preset maximum value of the program loop counter.

In another aspect, a method of a state machine configured to execute a sequence of instructions therethrough related to an erase operation performed on a non-volatile memory is disclosed. The method includes implementing an erase loop counter in the state machine, presetting a threshold for an electric current of memory cells of the non-volatile memory, a step time and a maximum value of the implemented erase loop counter, and resetting the implemented erase loop counter.

The method also includes performing the erase operation on the non-volatile memory at each memory location of an intended set of memory locations, which, in turn, includes: reading data bits from the each memory location based on addressing thereof, determining that the read data bits from the each memory location addressed does not match a data word solely including bits with polarity equal to 0 or 1, generating an erase pulse to erase the read data bits of the non-volatile memory at the each memory location addressed for the preset step time following the determination of the mismatch between the read data bits and the data word solely including bits with the polarity equal to 0 or 1, and incrementing the erase loop counter following the generation of the erase pulse related to the erasure of the read data bits of the each memory location addressed.

Further, the method includes determining that the incremented erase loop counter reaches the preset maximum value thereof, terminating the erase operation on the non-volatile memory based on the determination that the erase loop counter has reached the preset maximum value thereof, and maintaining, following the termination of the erase operation, the electric current of the each erased memory cell of the non-volatile memory at a level lower than the preset threshold based on the erase loop counter implementation in conjunction with the preset step time of erasing the read data bits from the each memory location addressed and the preset maximum value of the erase loop counter.

In yet another aspect, a system includes a non-volatile memory including memory cells, and a state machine communicatively coupled to the non-volatile memory. The state machine is configured to execute a sequence of instructions therethrough related to a program operation and/or an erase operation performed on the non-volatile memory. Based on the execution of the sequence of instructions during the program operation, the state machine is further configured to implement a program loop counter therein, preset a first threshold for an electric current of the memory cells of the non-volatile memory, a first step time and a maximum value of the implemented program loop counter, and reset the implemented program loop counter.

During the program operation, the state machine is also configured to program the non-volatile memory at each memory location of an intended set of memory locations, which, in turn includes: reading data from the each memory location based on addressing thereof, determining that the read data from the each memory location addressed does not match data to be programmed thereto, generating a program pulse to program the non-volatile memory at the each memory location addressed for the preset first step time following the determination of the mismatch between the read data and the data to be programmed, and incrementing the program loop counter following the generation of the program pulse related to the programming of the each memory location addressed.

Still further, during the program operation, the state machine is configured to determine that the incremented program loop counter reaches the preset maximum value thereof, terminate the program operation on the non-volatile memory based on the determination that the program loop counter has reached the preset maximum value thereof, and maintain, following the termination of the program operation, the electric current of the each programmed memory cell of the non-volatile memory at a level higher than the preset first threshold based on the program loop counter implementation in conjunction with the preset first step time of programming the each memory location addressed and the preset maximum value of the program loop counter.

Based on the execution of the sequence of instructions during the erase operation, the state machine is further configured to implement an erase loop counter therein, preset a second threshold for the electric current of the memory cells of the non-volatile memory, a second step time and a maximum value of the implemented erase loop counter, and reset the implemented erase loop counter.

During the erase operation, the state machine is also configured to perform the erase operation on the non-volatile memory at the each memory location of the intended set of memory locations, which, in turn, includes: reading data bits from the each memory location based on the addressing thereof, determining that the read data bits from the each memory location addressed does not match a data word solely including bits with polarity equal to 0 or 1, generating an erase pulse to erase the read data bits of the non-volatile memory at the each memory location addressed for the preset second step time following the determination of the mismatch between the read data bits and the data word solely comprising bits with the polarity equal to 0 or 1, and incrementing the erase loop counter following the generation of the erase pulse related to the erasure of the read data bits of the each memory location addressed.

Still further, during the erase operation, the state machine is configured to determine that the incremented erase loop counter reaches the preset maximum value thereof, terminate the erase operation on the non-volatile memory based on the determination that the erase loop counter has reached the preset maximum value thereof, and maintain, following the termination of the erase operation, the electric current of the each erased memory cell of the non-volatile memory at a level lower than the preset second threshold based on the erase loop counter implementation in conjunction with the preset second step time of erasing the read data bits from the each memory location addressed and the preset maximum value of the erase loop counter.

The methods and systems disclosed herein may be implemented in any means for achieving various aspects, and may be executed in a form of a non-transitory machine-readable medium embodying a set of instructions that, when executed by a machine, cause the machine to perform any of the operations disclosed herein.

Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which:

FIG. 1(c) is a plot of an example current distribution in the non-volatile memory of FIG. 1(a) following programming thereof for 5000 such write cycles.

Other features of the present embodiments will be apparent from the accompanying drawings and from the detailed description that follows.

DETAILED DESCRIPTION

Example embodiments, as described below, may be used to provide a method, a device, and/or a system of durable maintenance of a memory cell electric current sense window following program-erase operations to a non-volatile memory. Although the present embodiments have been described with reference to specific example embodiments, it will be evident that various modifications and changes may be made to these embodiments without departing from the broader spirit and scope of the various embodiments.

Electric currents of non-volatile memory cells (e.g., as described in commonly-owned U.S. Pat. No. 7,983,081) during program states thereof may be much higher than those during erase states thereof. The difference in electric cell currents during program and erase states may correspond to a maximum sense window within which the program state can be distinguished from the erase state by a sense amplifier utilized as part of memory circuitry including the non-volatile memory cells. The sense amplifier may sense signals that represent a data bit ('1' or '0') stored in a memory cell. In one or more embodiments, data polarity '0' may be associated with the erase state of a memory cell and data polarity '1' may be associated with the program state of the memory cell.

It should be noted that, in one or more alternative embodiments, data polarity '0' may be associated with the program state of the memory cell and data polarity '1' may be associated with the erase state of the memory cell. In the rest of this disclosure, the erase state is assigned data bit '0' and the program state is assigned data bit '1.' When a write to a memory cell is performed, said memory cell may first be erased and then programmed with the desired data. When data bit '0' is to be written, a program operation to the memory cell may be inhibited and the memory cell may stay in the erase state thereof. When data bit '1' is to be written, actual programming of the memory cell may occur and the memory cell may be transitioned to the program state after the program operation. In one or more embodiments, as the distribution of the memory cell current distribution discussed above is a function of factors associated with the memory circuitry thereof such as data retention time, endurance, signal noise and sense amplifier offset, the actual sense window may be smaller than the maximum sense window width.

Figure 1A:
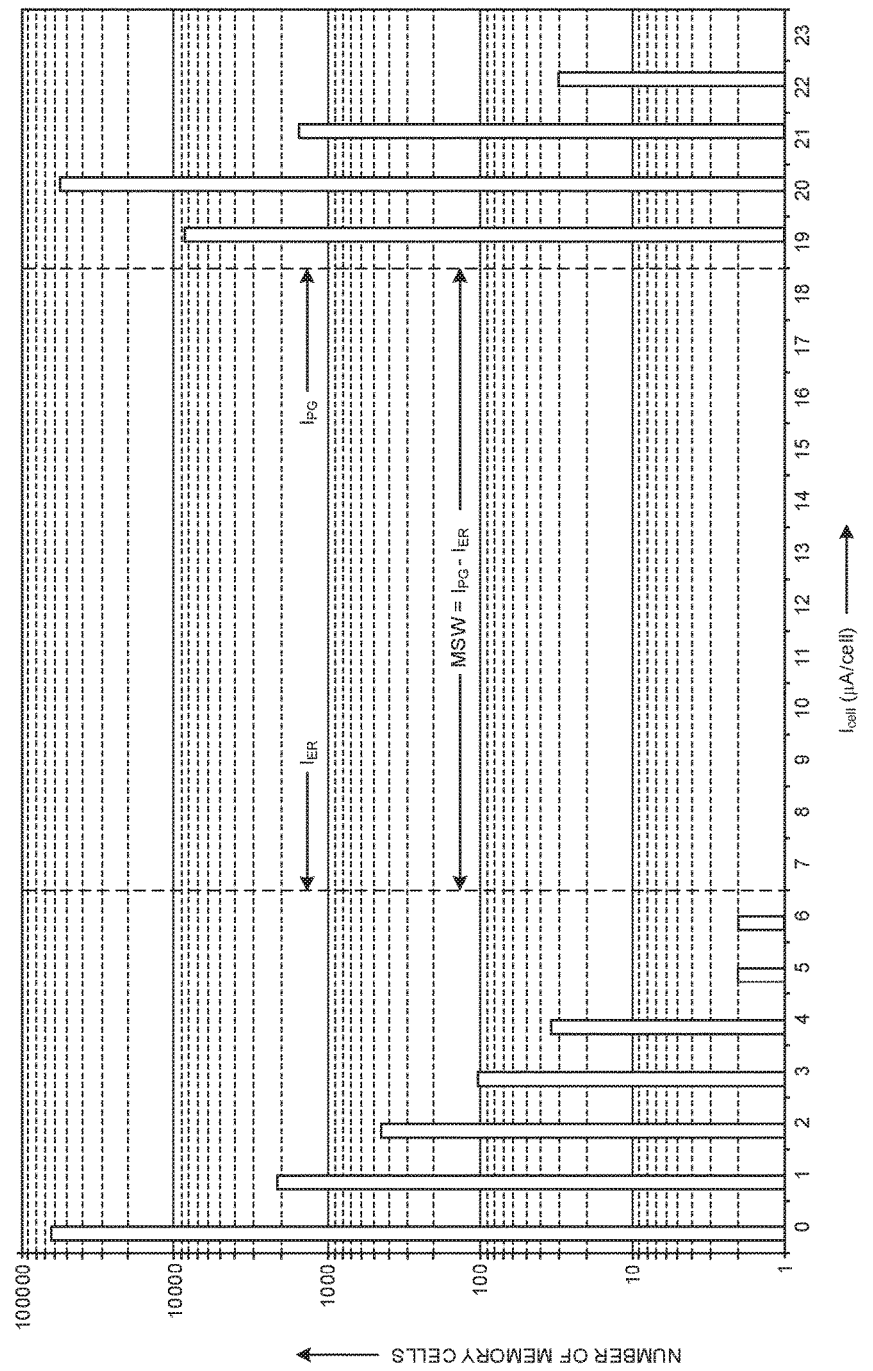
FIG. 1(a) is a plot of an example current distribution in a non-volatile memory including multiple rows and columns of memory cells following programming thereof for 1 write cycle, with a fixed time for an erase operation of 80 ms followed by a fixed time for a program operation of 30 µs.

FIG. 1 shows an example current distribution in a non-volatile memory including multiple rows and columns of memory cells (e.g., memory cells described in commonly-owned U.S. Pat. No. 7,983,081). FIG. 1(a) shows the current distribution of the non-volatile memory cells following programming thereof for 30 µs; the currents are shown as µA/cell; the non-volatile memory cells are first erased for 80 ms following fabrication of the silicon chip of the non-volatile memory. It should be noted that writing data to a memory cell may first involve erasing the cell and then programming the cell with the data to be stored.

FIG. 1(a) shows the cell current distribution being separated into two groups: (i) the group on the left with cell current ($I_{cell}$) lesser than 7 µA/cell represents the cell current distribution of the non-volatile memory after erasure thereof; $I_{ER}$ represents a maximum value of the cell current in the erase state, and (ii) the group on the right with cell current ($I_{cell}$) higher than 18 µA/cell represents the cell current distribution after programming of the non-volatile memory; $I_{PG}$ represents a minimum value of the cell current in the program state. The difference/gap between $I_{ER}$ and $I_{PG}$ may be the maximum sense window (MSW) within which the program state may be distinguished from the erase state by the sense amplifier. In this example illustrated in FIG. 1(a), the MSW is 11 µA/cell.

In one or more embodiments, by setting a reference current (e.g., 10 µA/cell) to be within the MSW, all memory cells in the erase state may have currents lesser than the reference current and all memory cells in the program state may have currents larger than the reference current. In one or more embodiments, a sense amplifier, which compares the cell current to the reference current, may therefore generate correct data polarity for a memory cell in the erase state and a memory cell in the program state.

In one or more embodiments, the endurance of a memory cell is the number of write (program-erase) cycles that said memory cell can go through before the cell current thereof falls within the sense window to result in a wrong data bit polarity being read following data sensing. FIG. 1 shows the cell current distribution of the non-volatile memory after (a) 1 write cycle, (b) 1000 write cycles, and (c) 5000 write cycles. Again, as mentioned above, the results are obtained when the non-volatile memory is erased with a fixed time of 80 ms and programmed with a fixed time of 30 µs for each program and erase operation.

Figure 1B:
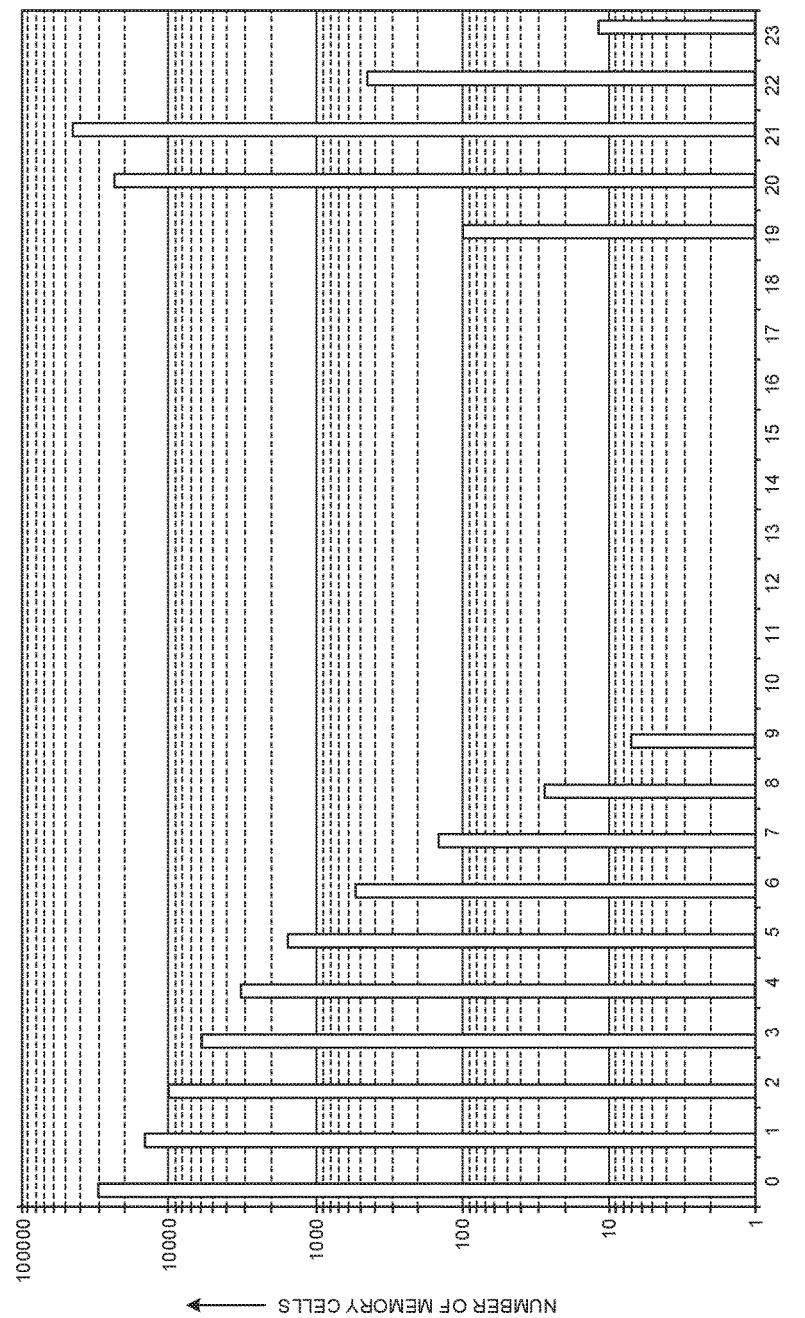
FIG. 1(b) is a plot of an example current distribution in the non-volatile memory of FIG. 1(a) following programming thereof for 1000 such write cycles.

The MSW in FIGS. 1(a), 1(b), and 1(c) are respectively 11 µA/cell, 8 µA/cell, and 6 µA/cell. Thus, as the number of write cycles to the non-volatile memory increases, the sense window decreases. The decrease in the sense window width (SWW) may be caused by the spreading out of the cell current distribution in the erase state, effected by the increase in overall value of the cell current in the erase state. The aforementioned increase indicates that the erase operation may be losing ground to the program operation. In one or more embodiments, as the number of program and erase operations increases, more and more electrons may be trapped in one or more floating gate(s) of the memory cells and cannot be evacuated by the erase operations. In one or more embodiments, the trapped electrons may lower the overall threshold voltage(s) of one or more tunneling transistor(s) of the memory cells, which results in an increase in cell current distribution of the non-volatile memory cells in the erase state.

If the reference current remains at 10 µA/cell, failure of the abovementioned sensing for some of the memory cells in the erase state may occur at or before endurance of 5000 cycles. This can be caused by either over-programming or under-erasing the non-volatile memory, whose effects may then accumulate to result in a data read failure as the number of write cycles to the memory cells increases. The overall sense window may also decrease as the number of cycles endured through the memory cells increases. This effect may be caused by increase in a number of traps and charge trapped in a tunnel oxide and/or oxide-silicon interface associated with the memory cells.

In one or more embodiments, the shifting and narrowing of the sense window may be alleviated by using a program and erase algorithm that ensures that all memory cells in the program state have a cell current higher than $I_{PG}$ and all memory cells in the erase state have a cell current lower than $I_{ER}$. This may ensure that the width of the sense window is maintained after each erase and/or program cycle.

Figure 2:
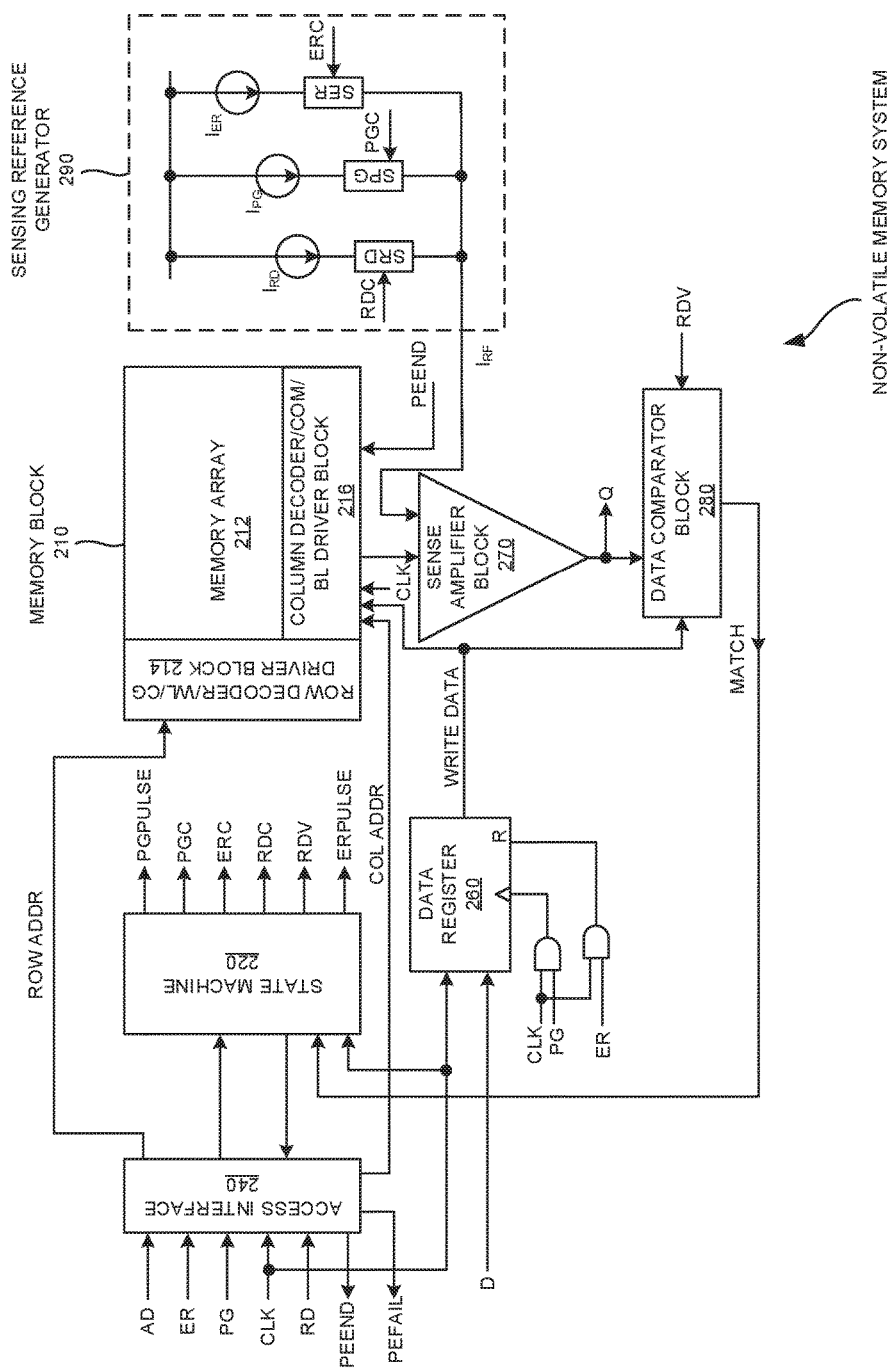
FIG. 2 is a schematic view of a non-volatile memory system, according to one or more embodiments.

FIG. 2 shows a non-volatile memory system 200, according to one or more embodiments. In an example embodiment, non-volatile memory system 200 may include 1000 bits of single-poly two-transistor-one-capacitor non-volatile memory cells. The memory cells may each include a floating poly-silicon gate and a single layer of poly-silicon (refer to the commonly-owned U.S. Pat. No. 7,983,081). Other types of memory cells are within the scope of the exemplary embodiments discussed herein.

Non-volatile memory system 200 may be configured to have 64 words, each of which has a size of 16 bits. It is obvious that the aforementioned word and bit sizes are merely for illustrative purposes and that other sizes are within the scope of the exemplary embodiments discussed herein. Non-volatile memory system 200 may include an address (AD) bus of 6 bits, a data (D) bus of 16 bits, a program (PG) control signal, an erase (ER) control signal, a read (RD) control signal and a clock (CLK) signal as inputs thereto. The output of non-volatile memory system 200 may include read data bus (Q) of 16 bits and a program-erase end (PEEND) signal. PG, ER and RD, when detected high at a rising edge of CLK, may indicate that a current memory access is a corresponding program cycle, an erase cycle and a read cycle respectively. During program access, program data may be input from D. During read access, read data may be output to Q.

Figure 3:
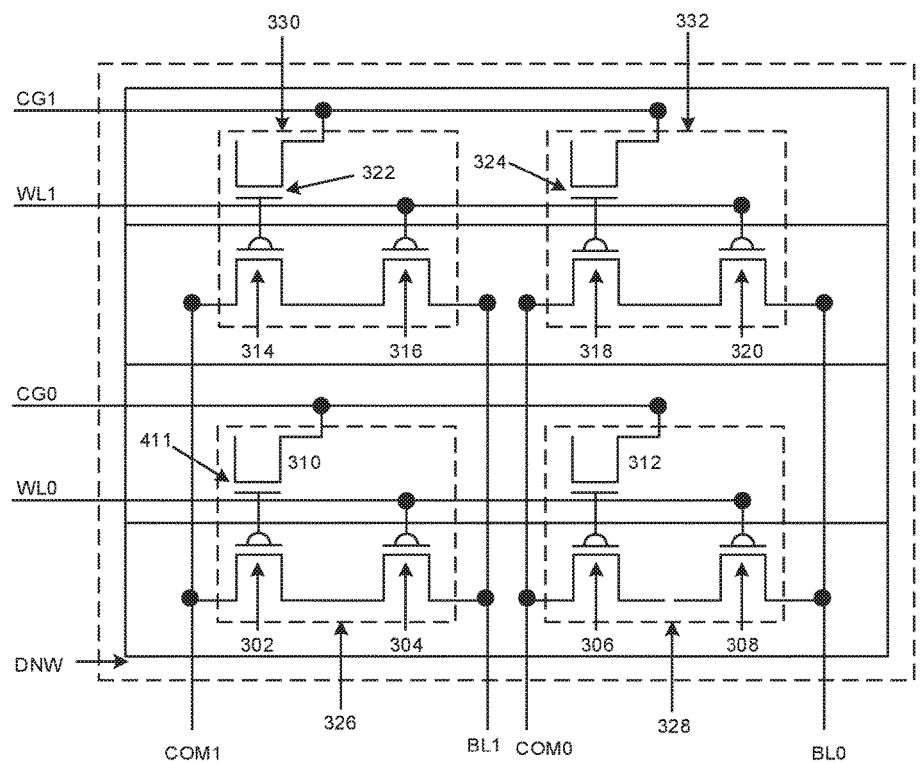
FIG. 3 is a schematic view of an example memory array of two rows and two columns.

As seen in FIG. 2, non-volatile memory system 200 may include a memory block 210, a state machine 220, an access interface 240, a data register 260, a sense amplifier block 270, a data comparator block 280 and a sensing reference generator 290. In one or more embodiments, memory block 210 may include one or more memory arrays 212, row decoder/word-line (WL)/control gate (CG) driver block 214 and column decoder/common (COM)/bit-line (BL) driver block 216. FIG. 3 shows an example memory array 300 of two rows and two columns; said example memory array 300 may be part of memory array 212. It is obvious that based on the schematic of example memory array 300/memory array 212 in FIGS. 2-3, a memory array including more rows and columns may be formed by one skilled in the art of non-volatile memory design.

Also, the memory cell(s) may resemble those described in the commonly-owned U.S. Pat. No. 7,983,081. Referring back to FIG. 3, the memory cells may be accessed through the activation of control gate signals CG0 and CG1, word lines WL0, and WL1, the common signals COM0 and COM1, the bit-lines BL0 and BL1, and the deep N-well signal DNW. FIG. 3 shows the constituent transistor elements of the memory cell(s) (326-332) in an appropriate order (transistors 302-324). The aforementioned memory cell signals may be driven to different voltages during memory access cycles: erase, program and read.

Referring to FIGS. 2-3, the row decoder of the row decoder/WL/CG driver block 214 may decode the row address from access interface 240 and activate the corresponding CG signal and WL signal. The CG, WL and DNW signals may be driven to specific voltages for different memory operations. The requisite voltages may be generated by different voltage generators (not shown) incorporated in row decoder/WL/CG driver block 214. The column decoder of column decoder/COM/BL driver block 216 may decode the column address from access interface 240 and activate the corresponding COM signal and BL signal. Again, the COM and BL signals may be driven to specific voltages during different memory operations, and the requisite voltages generated by different voltage generators (not shown) incorporated in column decoder/COM/BL driver block 216.

The different CG, WL, DNW, COM and BL voltages during program, erase, and read operations are listed in detail in the commonly-owned U.S. Pat. No. 7,983,081. State machine 220 may receive memory access signals from access interface 240, and output control signals: PGC and PGPulse for controlling the program operation with a verification operation (to be discussed below), ERC and ERPulse for controlling the erase operation with again a verification operation (to be discussed below), and RDC and RDV for controlling the read operation of memory block 210.

Access interface 240 may latch and buffer the input control and address signals AD, ER, PG, RD and CLK external to memory block 210 to state machine 220 and other functional blocks of non-volatile memory system 200. CLK may provide synchronization timing for controlling operation of memory block 210. Access interface 240 may also provide latching and buffering for external output control signal PEEND from state machine 220. The assertion of a high state of PEEND may signal the end of a program or an erase operation.

Data register 260 may include data registers for latching input write data from D and supplying said latched input write data to column decoder/COM/BL driver block 216 during a program operation. Sense amplifier block 270 may determine polarity of the data input from column decoder/COM/BL driver block 216 using the sensing reference current $I_{RF}$ supplied by sensing reference generator 290. The resultant sensed data through sense amplifier block 270 may be output to Q for driving to the external outputs. Said sensed data may also be input to data comparator block 280.

Data comparator block 280 may have two sets of inputs: (i) Q data from the output of sense amplifier block 270, and (ii) write data from the output of data register 260. The data from these two sets of inputs may be compared during each of program and erase operations. The compared result may then be output to the signal MATCH. When driven high, the MATCH signal may indicate that the sensed data in the Q bus matches the write data (e.g., in a Write Data bus). Data comparator block 280 may be activated by the read verification signal RDV generated by state machine 220 during the verification phase of the program operation and the erase operation.

Sensing reference generator 290 may generate reference current $I_{RF}$ and output $I_{RF}$ to sense amplifier block 270. Inside sensing reference generator 290, three current sources with different current outputs may be selectively gated to the output $I_{RF}$ signal during different memory operations. During a read operation, the SRD switch coupled between an $I_{RD}$ current source and the output $I_{RF}$ may be turned on. Likewise, during a program operation, the SPG switch coupled between an $I_{PG}$ current source and the output $I_{RF}$ may be turned on. During an erase operation, the SER switch coupled between an $I_{FR}$ current source and the output $I_{RF}$ may be turned on. Reference currents $I_{PG}$ and $I_{FR}$ may determine the upper and lower limit of the sense window. $I_{RD}$ may, in typical instances, be chosen to have a value equal to sum of $I_{PG}$ and $I_{ER}$ divided by 2 (($I_{PG}+I_{ER}$)/2). This may place $I_{RD}$ at the middle of the sense window.

In general, all input signals may be synchronized to the rising edge of CLK. However, it should be noted that other implementations involving synchronization of the input signals to the falling edge of CLK are also within the scope of the exemplary embodiments discussed herein. The input signals PG, ER, RD and AD may be latched at the rising edge of CLK by data latches inside access interface 240. Input data from D bus may also be latched at the rising edge of CLK by data latches in data register 260.

Figure 4:
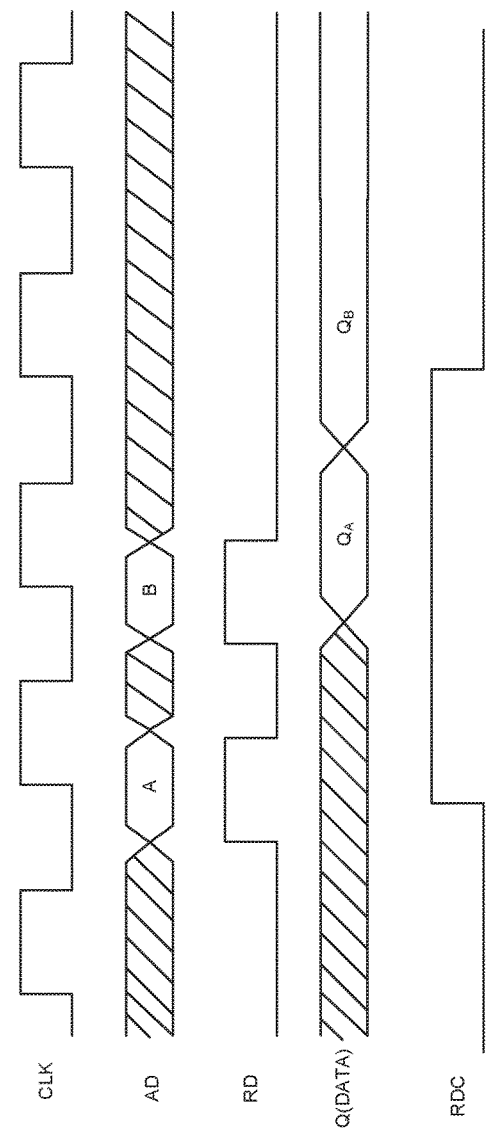
FIG. 4 is a timing waveform of a read access operation to the non-volatile memory system of FIG. 2.

FIG. 4 shows a timing waveform of the read access operation in non-volatile memory system 200. The read operation may start with an external memory accessing agent (not shown) putting a read address in AD and driving read control signal RD high. The read address (A and B) and the high state of RD may be latched in access interface 240 at the next rising edge of CLK. The latched row address may be routed to the input of the row decoder of row decoder/word-line (WL)/control gate (CG) driver block 214. The row decoder may decode the row address and activate the corresponding word-line WL and control gate CG in memory array 212 of memory block 210. The latched column address may be routed to the input of the column decoder of column decoder/COM/BL driver block 216.

The column decoder may decode the column address and activate the corresponding common COM and bit-line BL. The memory cells of memory array 212 selected by the row and column addresses may then be activated, following which cell currents thereof may flow to the input of sense amplifier block 270. In access interface 240, the high state of RD may be latched and the latched output may be input to state machine 220; RDC may be output from state machine 220. RDC may then be routed to the input of sense amplifier block 270 to activate sense amplifiers therein. In sensing reference generator 290, the high state of RDC may cause switch SRD to turn on; consequently, read reference current $I_{RD}$ may be routed to $I_{RF}$ and input to sense amplifier block 270. In sense amplifier block 270, the output data polarity may be determined by comparing the read cell current (e.g., $I_{CC}$) to the reference current $I_{RD}$. The output (data) of sense amplifier block 270 may then be presented to the Q bus (data).

Figure 5:
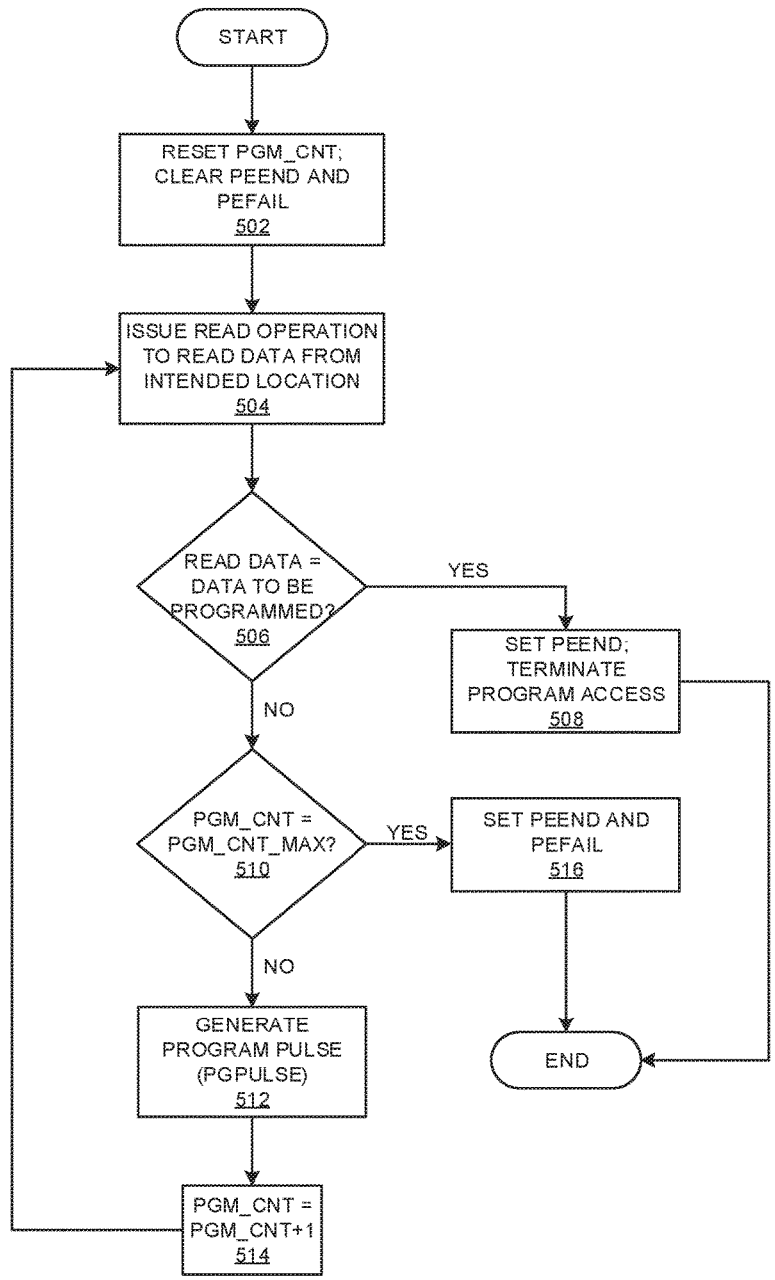
FIG. 5 is a flowchart detailing the operations involved during execution of a sequence of program and read instructions with verification on the non-volatile memory system of FIG. 2, according to one or more embodiments.

During a program access operation, exemplary embodiments discussed herein may execute a sequence of program and read instructions on state machine 220 (or, on a generic processor (e.g., a microprocessor) implementation). In one or more embodiments, the aforementioned sequence of instructions may replace the traditional fixed-time programming commonly employed. In one or more embodiments, instead of using a long fixed program time (e.g., 50 μs), a program-verification loop with a small program step time (e.g., 5 μs) may be used. FIG. 5 shows a flowchart detailing the operations involved during execution of the sequence of program and read instructions with verification, according to one or more embodiments. In one or more embodiments, operation 502 may involve resetting a program loop counter (PGM_CNT) and clearing of a program-erase end flag PEEND, and a program-erase fail flag PEFAIL.

In one or more embodiments, operation 504 may involve issuing a read operation to read data from an intended memory location based on addressing thereof. In one or more embodiments, operation 506 may involve comparing the read data with data to be programmed. In one or more embodiments, if the read data matches the data to be programmed, operation 508 may involve setting PEEND flag and terminating the program access. In one or more embodiments, if the read data does not match the data to be programmed, operation 510 may involve checking whether the program loop counter reaches a maximum value (PGM_CNT_MAX) thereof.

In one or more embodiments, if the program loop counter has not reached PGM_CNT_MAX, operation 512 may involve generating a program pulse (PGPulse) to program the memory cells of memory array 212 at the addressed location for a preset program step time. In one or more embodiments, operation 514 may then involve incrementing the program loop counter. In one or more embodiments, control may then be passed to operation 504, following which another loop of read, verification and program operations is completed. In one or more embodiments, the process may be terminated when the program loop counter reaches PGM_CNT_MAX; here, the PEEND and PEFAIL flags may be set in operation 516. In one or more embodiments, this may indicate that the program operation is not successful and the desired write data cannot be stored correctly in the desired memory location.

In one or more embodiments, as seen above, the abovementioned sequence of program and read instructions including verification may involve a read operation and a comparison operation after each program step. This may ensure that the memory cells of memory array 212 are not under-programmed and that each programmed memory cell has a cell current more than $I_{ER}$, the upper limit of the sense window discussed above. Also, this may limit an amount of memory cell over-programming as memory cells within a word are in close proximity to each other and respond similarly to the same program voltages and time. Because of the aforementioned close proximity of the memory cells within a word and the consequent similarity in response, the number of programming steps required to program each memory cell in the same word may not vary much.

Figure 6:
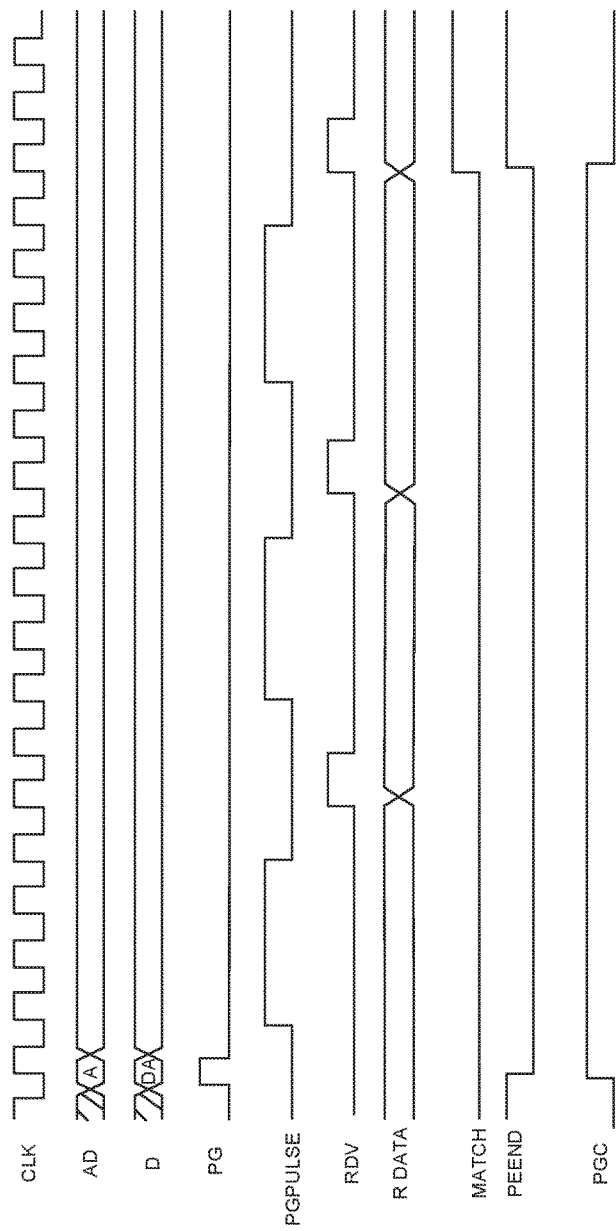
FIG. 6 is a timing waveform of a program access operation to the non-volatile memory system of FIG. 2.

FIG. 6 shows the timing waveform of non-volatile memory system 200 for the program access discussed above. The signals CLK, PG, AD and D may be external inputs to non-volatile memory system 200. Signals PEEND and PEFAIL may be external outputs from non-volatile memory system 200. Other signals may be internal signals. In one or more embodiments, the program access to non-volatile memory system 200 may start with an external agent (not shown) driving address A and write data DA to the input address bus AD and data bus D respectively. In one or more embodiments, said external agent may also drive the program access signal PG high.

Figure 7:
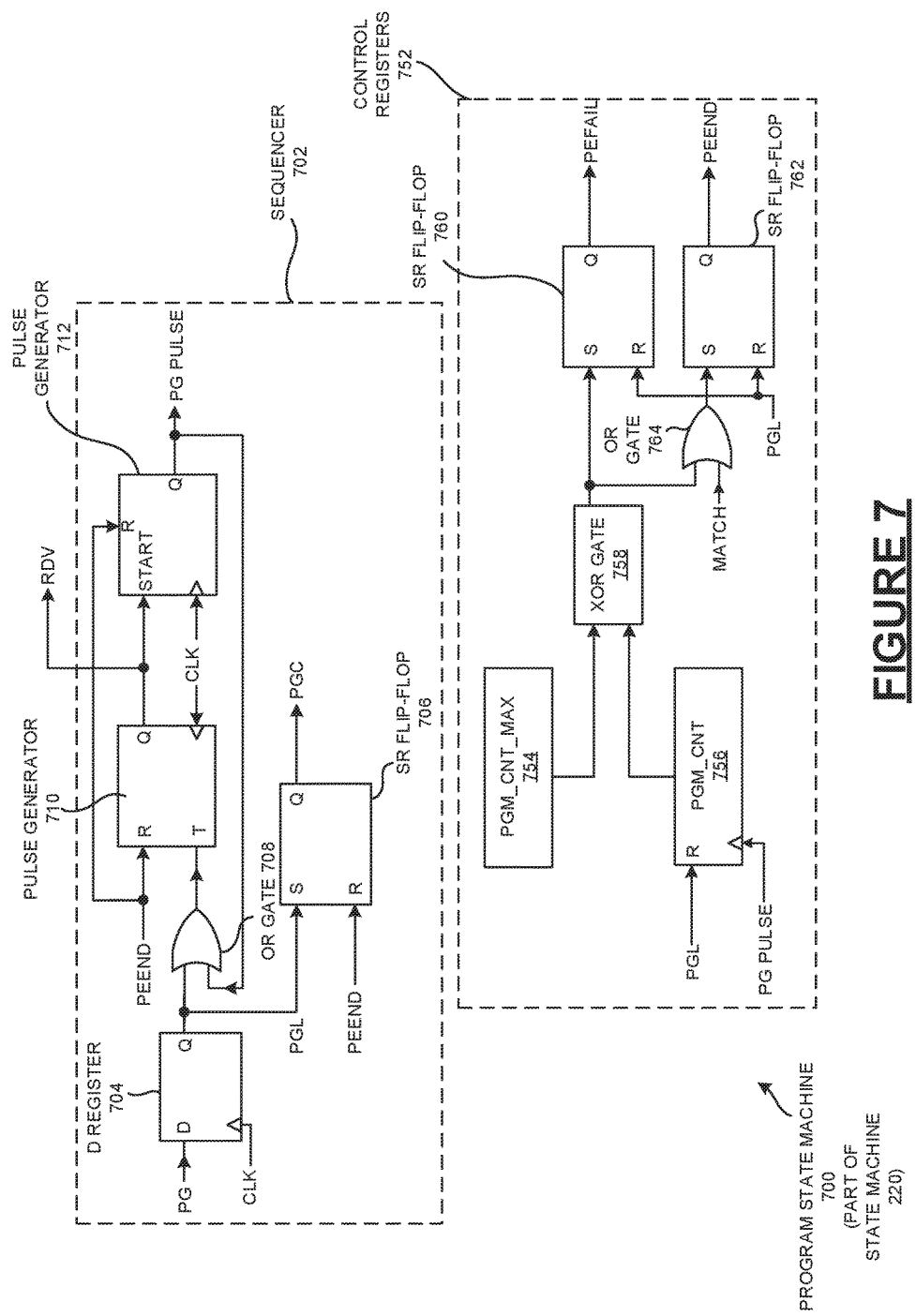
FIG. 7 is a schematic view of an example implementation of a program state machine, which is part of a state machine of the non-volatile memory system of FIG. 2.

In one or more embodiments, inside non-volatile memory system 200, address A may be latched in access interface 240. In one or more embodiments, the row address may then be passed to the row decoder discussed above and the column address passed to the column decoder discussed above. In one or more embodiments, the write data DA may be latched in data register 260 and driven to the Write Data bus. In one or more embodiments, PG may be passed to state machine 220. FIG. 7 shows an example implementation of a program state machine 700, which may be part of state machine 220 that executes the sequence of program and read instructions with verification. In one or more embodiments, program state machine 700 may also generate external output signals PEEND and PEFAIL.

In one or more embodiments, state machine 220 may include a sequencer 702 and control registers 752. In one or more embodiments, sequencer 702 may include a D register 704, a set-reset (SR) flip-flop 706, an OR gate 708, pulse generator 710 and pulse generator 712. In one or more embodiments, sequencer 702 may generate control signals RDV and PGPulse for controlling the verification phase and program phase respectively of the abovementioned sequence of program and read instructions. In one or more embodiments, control registers 752 may include register PGM_CNT_MAX 754, a bit counter (e.g., a 4-bit counter) PGM_CNT 756, an XOR gate 758, SR flip-flop 760, SR flip-flop 762 and an OR gate 764. In one or more embodiments, control registers 752 may control the termination of the program verification process (based on executing the sequence of program and read instructions) discussed above and setting the states of flags PEEND and PEFAIL.

In one or more embodiments, with reference to the program access discussed above, input PG of sequencer 702 may be latched by D register 704 at the rising edge (or, falling edge, depending on the implementation) of CLK. In one or more embodiments the high state of the output signal PGL may set the output of SR flip-flop 706, PGC, high. In one or more embodiments, PGC may stay high until the program verification algorithm is completed. In one or more embodiments, the high state of PGL may also reset PGM_CNT 756 to 0, SR flip-flop 760, SR flip-flop 762 and outputs thereof, PEFAIL and PEEND, to 0.

In one or more embodiments, the high state of PGL may cause the output of OR gate 708 to go high. In one or more embodiments, in the next clock cycle, PGL goes low. The high to low transition of PGL followed by the high to low transition at the trigger (T) input of pulse generator 710 causes RDV to go high in the next CLK rising edge. In one or more embodiments, T input of pulse generator 710 may be edge triggered, e.g., triggered by the falling edge of the signal at the T input thereof. In one or more embodiments, RDV may stay high for one CLK cycle. In one or more embodiments, the high-state of RDV may cause memory cells selected by the row and column addresses to turn on and cell currents thereof routed to sense amplifier block 270.

In one or more embodiments, the high state of PGC may select the program reference current $I_{PG}$ as an input to sense amplifier block 270. In one or more embodiments, if the selected program cell currents exceed $I_{PG}$ in sense amplifier block 270, then the corresponding read data bits in the Q bus may have a data polarity of 1. In one or more embodiments, the read data may be compared with the write data in data comparator block 280. In one or more embodiments, if the comparison indicates a match, then the MATCH signal may be driven high to set output SR flip-flop 762 in FIG. 7 to a high state. In one or more embodiments, thus PEEND may be driven high and the program access terminated with both pulse generator 710 and pulse generator 712 reset.

In one or more embodiments, if the read data in the Q bus does not match the write data, then pulse generator 712 may drive PGPulse high in the next rising edge of CLK after RDV goes low. In one or more embodiments, the high-state of PGPulse may enable high-voltage generators in the row decoder and the column decoder to generate the different voltages necessary to cause hot-channel electron tunneling in the memory cells selected by the row and column addresses. In one or more embodiments, the duration of the PGPulse may determine the duration of the programming. In one or more embodiments, the amount of time/CLK cycles PGPulse stays high may equal the program step time discussed with respect to the flowchart shown in FIG. 5.

In an example implementation, the program step time may be set to 5 μs. In an example embodiment, the pulse generator(s) may be constructed readily using a binary counter that counts a predetermined number of CLK periods/cycles. Once the predetermined number of CLK periods/cycles is reached, PGPulse may be driven low, which, in turn, causes pulse generator 710 to drive RDV high for one CLK period/cycle. PGM_CNT 756 may be incremented by PGPulse. As shown in the timing diagram of FIG. 6, RDV and PGPulse may be generated alternatively until the MATCH signal goes high or the value in PGM_CNT 756 equals the preset value in PGM_CNT_MAX 758. In case the preset value is reached before the MATCH signal goes high, SR flip-flop 760 and SR flip-flop 762 may both be set, thereby causing PEEND and PEFAIL to go high.

Figure 8:
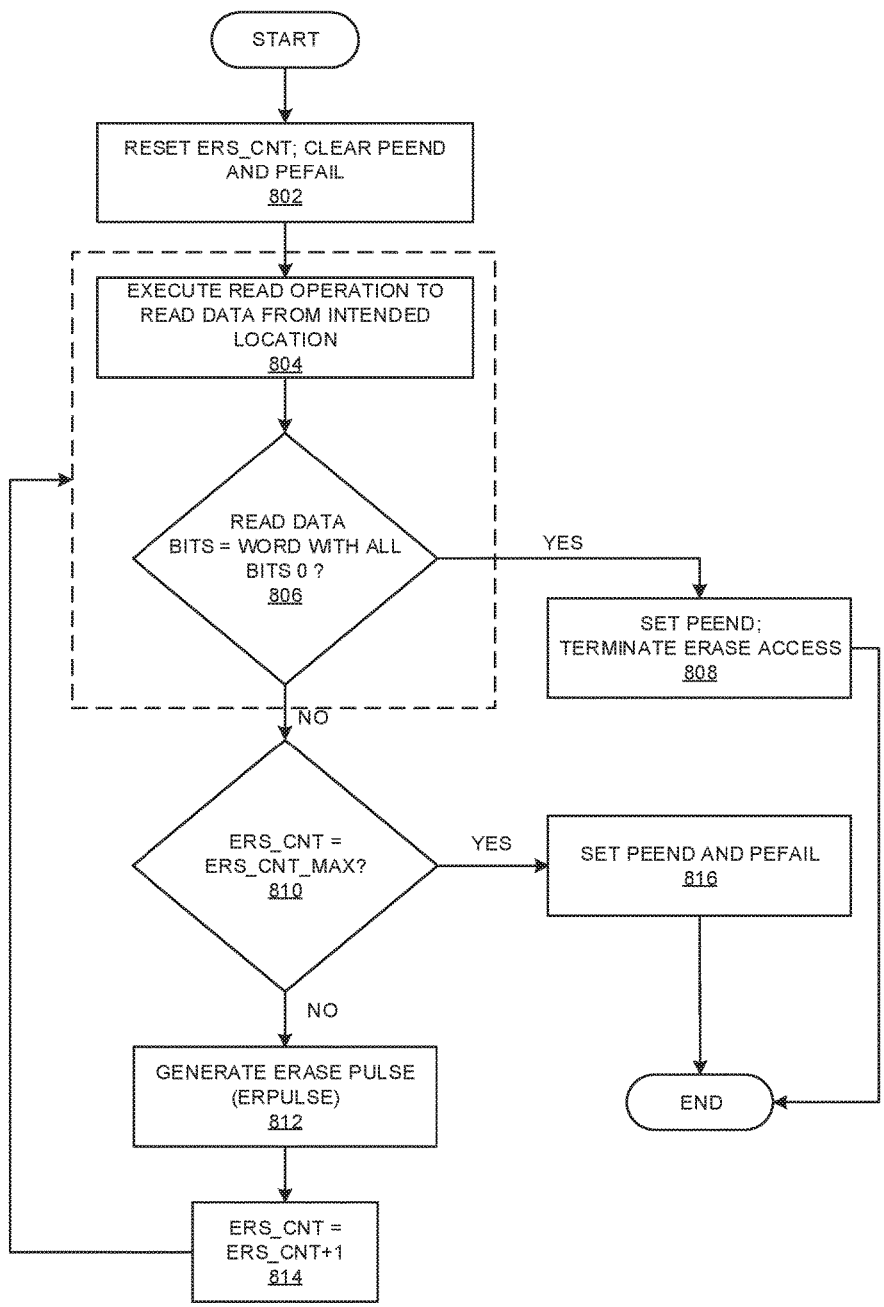
FIG. 8 is a flowchart detailing the operations involved during execution of a sequence of erase and read instructions with verification on the non-volatile memory system of FIG. 2, according to one or more embodiments.

During an erase access, exemplary embodiments discussed herein may execute a sequence of erase and read instructions in accordance with the flowchart shown in FIG. 8. Again, analogous to the discussion relevant to FIG. 5, the erase-with-verification algorithm may be used to replace the simple fixed time erase operation commonly employed. In one or more embodiments, instead of using a long and fixed erase time (e.g., 50 ms), an erase-verification loop with a small erase step time (e.g., 5 ms) may be employed.

Referring to the flow chart of FIG. 8, operation 802 may involve resetting an erase loop counter (ERS_CNT) and clearing the PEEND flag and the PEFAIL flag. In one or more embodiments, operation 804 may involve executing a read operation to read data from the intended erase locations (memory locations) based on addressing thereof. In the case of a flash memory, each erase access may erase a block or a page of memory cells spanning across multiple address locations. The number of addresses in the block may vary from 1 to all of the address locations in the memory. In an example implementation of the exemplary embodiments discussed herein, the erase block or page size is 4 words of 16 bits each.

In one or more embodiments, the read verify operations (806, 808 to be discussed), however, may be executed one address location at a time. In one or more embodiments, operation 806 may involve comparing the read data word with a data "all 0" in which every bit of the word has a value/polarity of 0 (or, 1, in an alternate implementation within the scope of the exemplary embodiments discussed herein). In one or more embodiments, if the comparison yields that all the read data bits are 0, operations 804 and 806 may be repeated until the comparison fails or every word in an accessed memory page is verified to be "all 0." In one or more embodiments, if every word in the accessed page has "all 0" data, operation 808 may involve setting the PEEND flag and terminating the erase access.

In one or more embodiments, if the result of the comparison in operation 806 is a mismatch, operation 810 may involve checking whether the erase loop count, ERS_CNT, has reached the maximum count value, ERS_CNT_MAX, thereof. In one or more embodiments, if ERS_CNT has not reached ERS_CNT_MAX, operation 812 may involve generating an erase pulse to erase all memory cells in the accessed page for a preset erase step time. In one or more embodiments, operation 814 may then involve incrementing ERS_CNT. In one or more embodiments, control may then be passed to the set of operations 804 and 806, following which another loop of read, verification and erase operations is completed.

In one or more embodiments, the erase access process may be terminated if ERS_CNT reaches ERS_CNT_MAX; here, the PEEND and the PEFAIL flags are set in operation 816, thereby indicating that the erase operation is not successful and some or all of the memory cells in the accessed page have cell currents larger than the lower limit ($I_{PG}$) of the sense window discussed above.

In one or more embodiments, the abovementioned sequence of erase and read instructions with verification may ensure that the memory cells are not under-erased. Also, the abovementioned sequence of erase and read instructions may limit the amount of over-erasing, as the memory cells within a page are in close proximity to each other and respond similarly to the erase voltages; due to the close proximity and the similarity in response, the number of erase steps required to erase each memory cell in the same page may not vary much.

Figure 9:
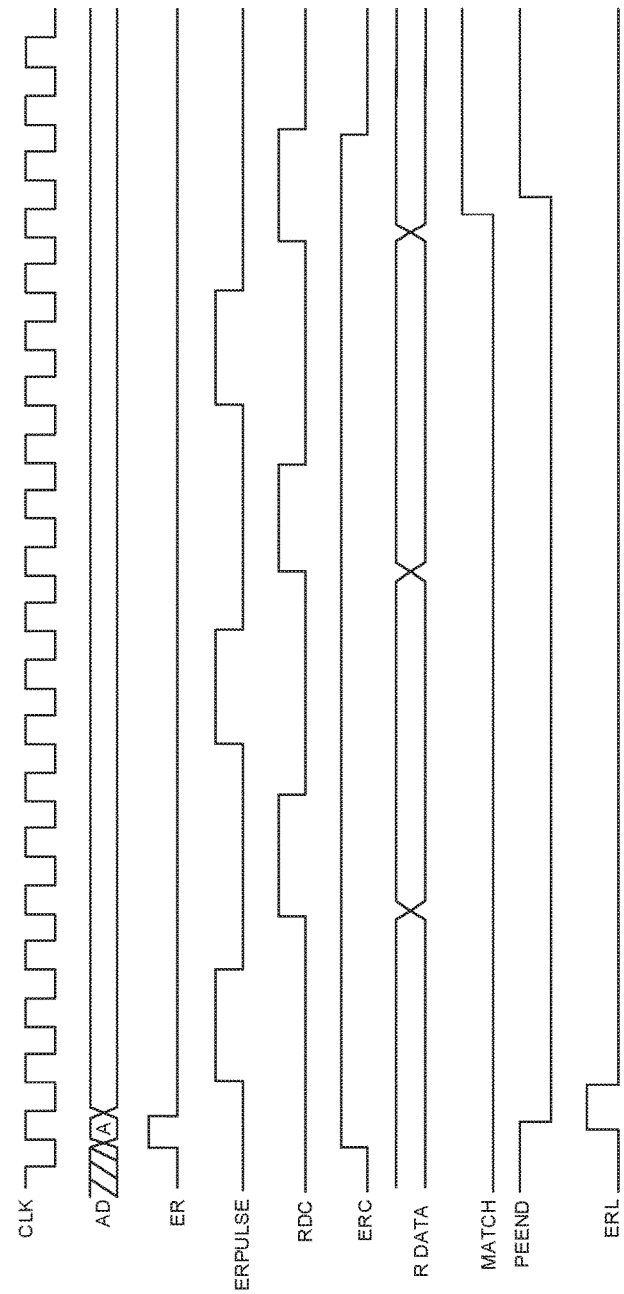
FIG. 9 is a timing waveform of an erase access operation to the non-volatile memory system of FIG. 2.

FIG. 9 shows the timing waveform of non-volatile memory system 200 for the erase access discussed above. The signals CLK, ER and AD may be external inputs to non-volatile memory system 200. Signals PEEND and PEFAIL may be external outputs from non-volatile memory system 200. Again, other signals may be internal signals. It should be noted that the timing diagram for the erase access is very similar to that of the program access shown in FIG. 6. In one or more embodiments, an erase access to non-volatile memory system 200 may start with an external agent (not shown) driving page address A to the input address bus AD and data bus D respectively.

In one or more embodiments, the external agent may also drive the erase access signal ER high. In one or more embodiments, the address A may be latched in access interface 240 inside non-volatile memory system 200. In an example implementation, memory array 212 may be arranged such that each row contains one page of 4 words. The row address may then be passed to the row decoder. However, the column address in the Col Addr bus may be ignored as the whole page is erased. The column address may be generated by a binary counter (not shown) in the column decoder.

The address counter may be reset by the high-state of PEEND. Output of the address counter may be selected to drive the column decoder during erase access when the ERC signal is high. The column address counter may be enabled by the high state of the RDV and ERC signals and incremented by the toggling of the CLK signal. Data register 260 may be reset so that all the data bits in the Write Data bus have a value/polarity of 0. Signal ER may then be passed to state machine 200.

Figure 10:
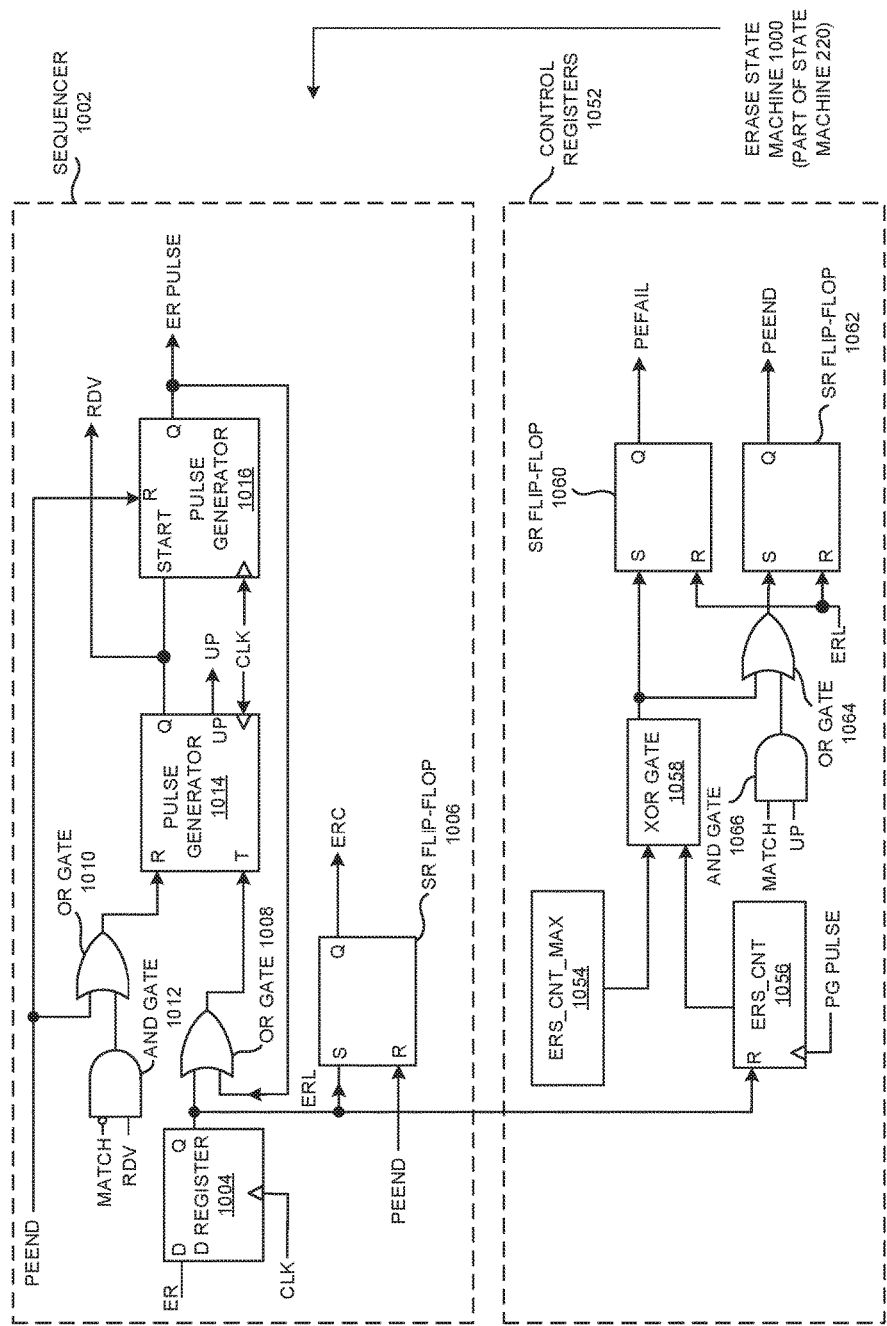
FIG. 10 is a schematic view of an example implementation of an erase state machine, which is part of the state machine of the non-volatile memory system of FIG. 2.

FIG. 10 shows an example implementation of an erase state machine 1000, which may be part of state machine 220 that generates control signals for the erase-with-verification operation. It should be noted that state machine 220 for the erase operation may be similar to state machine 220 for the program operation discussed above. The only difference may be in the construction of pulse generators analogous to pulse generator 710 and pulse generator 712 of FIG. 7. Here, the analogue to pulse generator 710 may be required to generate a high output period of up to four clock cycles to enable four successive read verification cycles for the 4 words of the accessed page. The output pulse width of the analogue to pulse generator 712 may be required to be equal to the erase step duration of 5 ms.

Again, state machine 220 may include sequencer 1002 and control registers 1052. Sequencer 1002 may include D register 1004, SR flip-flop 1006, OR gate 1008, OR gate 1010, AND gate 1012, pulse generator 1014 (analogous to pulse generator 710) and pulse generator 1016 (analogous to pulse generator 712). Sequencer 1002 may generate control signals RDV and ERPulse for the verification phase and program phase of the algorithm respectively. Control registers 1052 may include register ERS_CNT_MAX 1054, a bit counter (e.g., a 4-bit counter) ERS_CNT 1056, XOR gate 1058, SR flip-flop 1060, SR flip-flop 1062, OR gate 1064 and AND gate 1066. Control registers 1052 may control the termination of the erase-verification execution and the setting of the states of the flags PEEND and PEFAIL.

In one or more embodiments, with respect to the erase access, input ER may be latched by D register 1004 at the rising edge (or, falling edge, depending on the implementation thereof) of CLK. The high state of the output signal ERL may set the output of SR flip-flop 1006, ERC, high, and the erase loop counter ERS_CNT 1056 to 0. ERC may stay high until the program-verification algorithm is completed. The high state of ERL may also reset SR flip-flop 1060 and SR flip-flop 1062 and outputs thereof, PEFAIL and PEEND, to 0, thereby starting the execution of the program-verification algorithm/sequence of instructions.

Before the next clock cycle, ER may go low. This may cause ERL to go low at the beginning of next clock cycle. The high to low transition of ERL may cause the T input of pulse generator 1014 to go through a high-to-low transition and the output thereof, RDV, to go high in the next CLK rising-edge. Pulse generator 1014 may be edge triggered; pulse generator 1014 may be triggered by the falling edge of the signal at the T input thereof. The high state of RDV may cause memory cells selected by the row address and the column address in the address counter to turn on and cell currents thereof routed to sense amplifier block 270.

The high state of ERC may select the program reference current $I_{ER}$ as an input to sense amplifier block 270. In sense amplifier block 270, if the selected cell currents are less than $I_{ER}$, then the corresponding read data bits in the Q bus may have a data polarity of 0. The read data may be compared with the "all 0" data in data comparator block 280. If the comparison is a mismatch, the output of AND gate 1012 may go high, which causes the output of OR gate 1010 to go high, thereby resetting pulse generator 1014 and output RDV thereof to low. If the comparison is a match, then the MATCH signal may be driven high. The high state of MATCH may cause the output of AND gate 1012 to go low.

As PEEND stays low, the output of OR gate 1010 may stay low and pulse generator 1014 may not be reset; the output of pulse generator 1014 may continue to drive RDV high. The address counter in the column decoder may increment by 1 in the next rising edge of CLK. Then, the read and comparison of the second word may start. The read and comparison operations may continue to the third word if the second word data comparison results in a match. The read and comparison operations may continue until either a mismatch occurs or the fourth word is compared with a match. If a mismatch occurs in any of the data comparisons, output of AND gate 1012 and OR gate 1010 may go high, thereby resetting pulse generator 1014 and causing RDV to go low.

The high-to-low transition of RDV may cause pulse generator 1016 to drive the output ERPulse thereof high in the next rising edge of CLK. The high state of ERPulse may enable high-voltage generators in the row decoder and the column decoder to generate the different voltages necessary to cause Fowler-Nordheim (FN) tunneling in the memory cells selected by the row and column addresses. The duration of the ERPulse may determine the duration of the erase operation. ERPulse may be designed to stay high for a number of CLK cycles so that the ERPulse high time may equal the erase step time discussed with respect to the flowchart shown in FIG. 8. In one example implementation, the erase step time may be set at 5 ms.

Then, the output of pulse generator 1016 may go low. ERS_CNT 1056 may be incremented by the toggling of ERPulse. As shown in the timing diagram of FIG. 9, RDV and ERPulse may be generated alternatively until the MATCH signal goes high and stays high for all four read and comparison cycles or the value in ERS_CNT 1056 equals the preset value in ERS_CNT_MAX 1054. In case the preset value is reached before all 4 words in the page have data equal to "all 0," output of XOR gate 1058 goes high, thereby setting the outputs of SR flip-flop 1060 and SR flip-flop 1062, PEFAIL and PEEND, high. This may signal the termination of the erase access; some or all of the accessed memory cells cannot be erased below the lower limit, $I_{ER}$, of the sense window.

When pulse generator 1014 drives RDV high for the fourth CLK cycle, pulse generator 1014 also may drive an output thereof, UP, high. In case all 4 words have data equal to "all 0," both UP and MATCH may be high, causing output of AND gate 1066 and OR gate 1064 to go high; this may set the output of SR flip-flop 1062, PEEND, high and terminate the erase access with both pulse generator 1014 and pulse generator 1016 reset. The high state of PEEND and the low state of PEFAIL may indicate that the erase operation is successful in lowering the currents of all the memory cells in the accessed page to a value below $I_{ER}$, the lower limit of the sense window.

Figure 11:
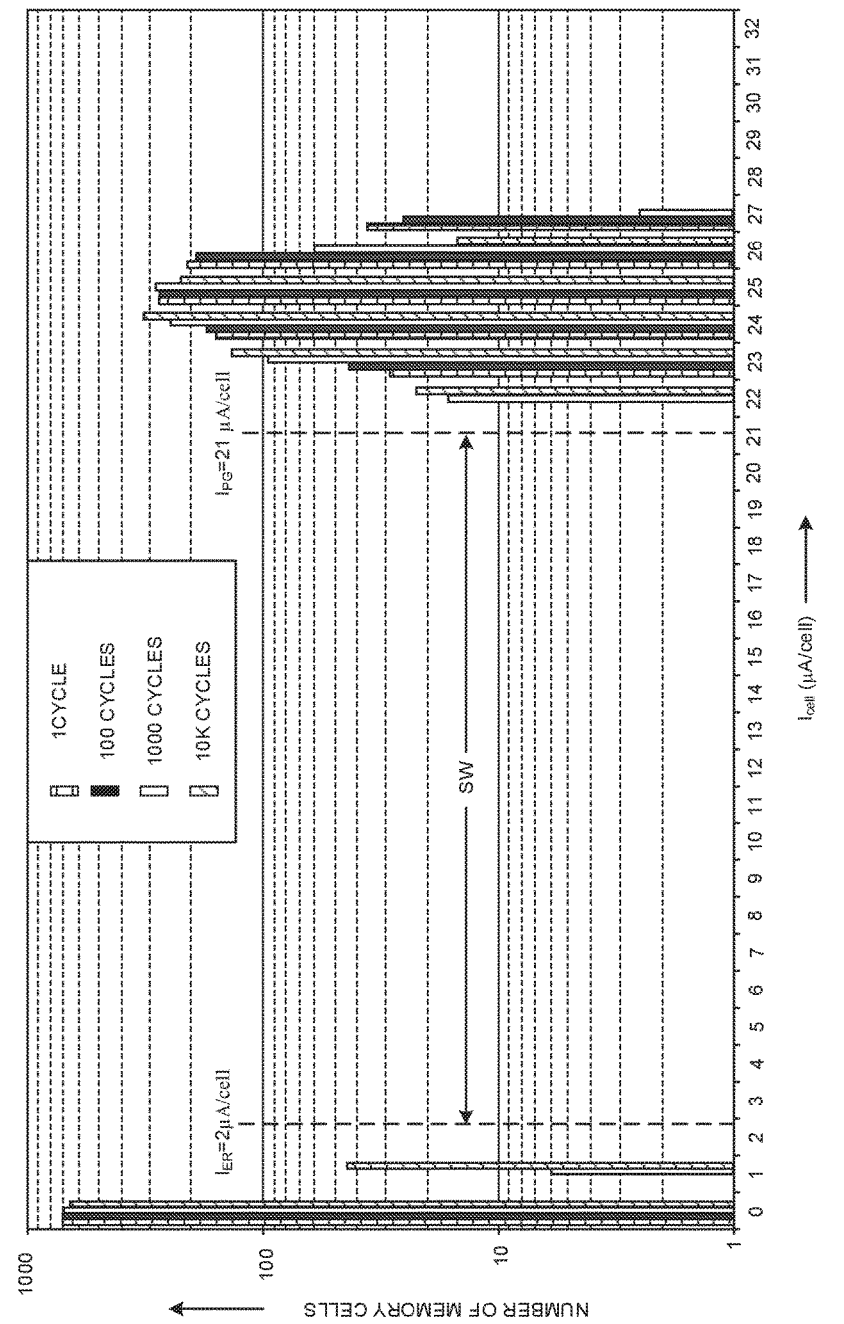
FIG. 11 is a plot of an example memory cell current distribution of the non-volatile memory system of FIG. 2.

FIG. 11 shows the memory cell current distribution of non-volatile memory system 200 implemented using a scheme similar to exemplary embodiments discussed herein with $I_{ER}$ set at 2 µA/cell and $I_{PG}$ set at 21 µA/cell. Here, the cell current distribution is measured and plotted for different numbers of endurance cycles of the memory. As shown in FIG. 11, the sense window (SW) is well maintained even after 10K program-erase cycles, thereby indicating high endurance.

Figure 12:
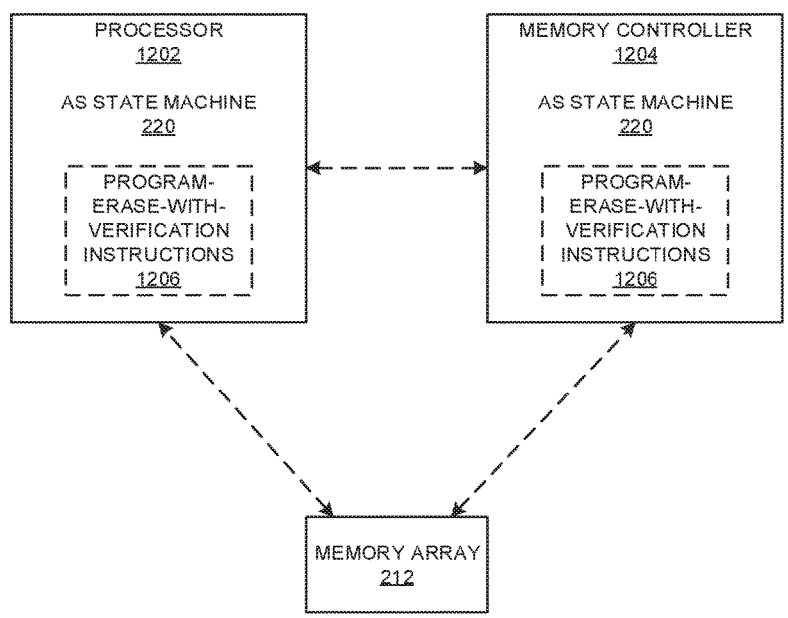
FIG. 12 is a schematic view of an example alternate implementation of the state machine of the non-volatile memory system of FIG. 2.

FIG. 12 shows an example alternate implementation of state machine 220 through a processor 1202 and/or a memory controller 1204. Here, processor 1202 and/or memory controller 1204 may execute the program-erase-with-verification instructions (e.g., shown as program-erase-with-verification instructions 1206) discussed above.

Figure 13:
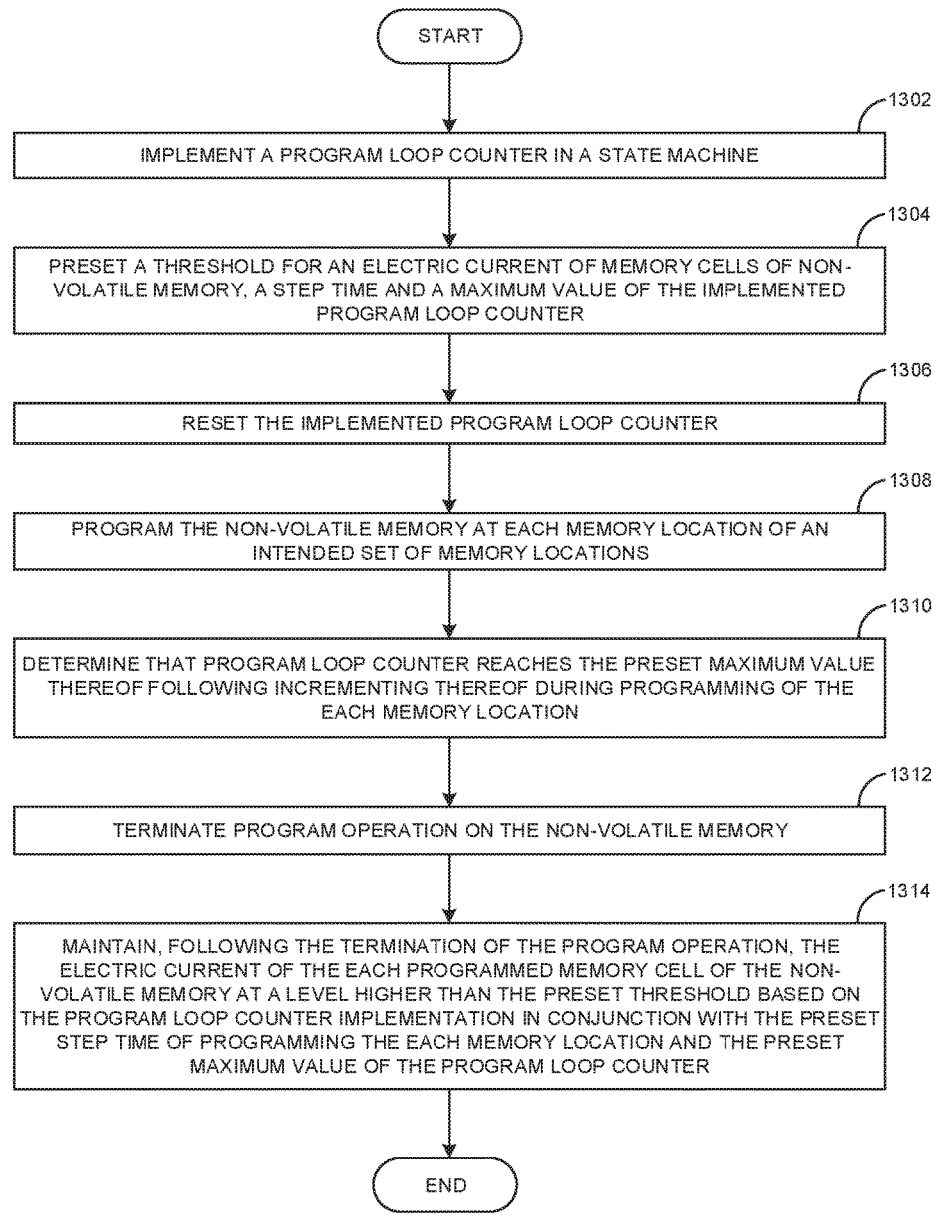
FIG. 13 is a process flow diagram detailing the operations involved in the state machine of the non-volatile memory system of FIG. 2 executing a sequence of instructions therethrough related to a program operation performed on a non-volatile memory thereof, according to one or more embodiments.

FIG. 13 shows a process flow diagram detailing the operations involved in a method of state machine 220 configured to execute a sequence of instructions therethrough related to a program operation performed on a non-volatile memory (e.g., memory array 212), according to one or more embodiments. In one or more embodiments, operation 1302 may involve implementing a program loop counter (e.g., PGM_CNT 756) in state machine 220. In one or more embodiments, operation 1304 may involve presetting a threshold (e.g., $I_{PG}$) for an electric current of memory cells of the non-volatile memory, a step time (5 µs) and a maximum value (e.g., PGM_CNT_MAX 754) of the implemented program loop counter. In one or more embodiments, operation 1306 may involve resetting the implemented program loop counter.

In one or more embodiments, operation 1308 may involve programming the non-volatile memory at each memory location of an intended set of memory locations. In one or more embodiments, the sub-operations of operation 1308 may involve reading data from the each memory location based on addressing thereof, determining that the read data from the each memory location addressed does not match data to be programmed thereto, generating a program pulse (e.g., PGPulse) to program the non-volatile memory at the each memory location addressed for the preset step time following the determination of the mismatch between the read data and the data to be programmed, and incrementing the program loop counter following the generation of the program pulse related to the programming of the each memory location addressed.

In one or more embodiments, operation 1310 may involve determining that the incremented program loop counter reaches the preset maximum value thereof. In one or more embodiments, operation 1312 may involve terminating the program operation on the non-volatile memory based on the determination that the program loop counter has reached the preset maximum value thereof. In one or more embodiments, operation 1314 may then involve maintaining, following the termination of the program operation, the electric current of the each programmed memory cell of the non-volatile memory at a level higher than the preset threshold based on the program loop counter implementation in conjunction with the preset step time of programming the each memory location addressed and the preset maximum value of the program loop counter.

Figure 14:
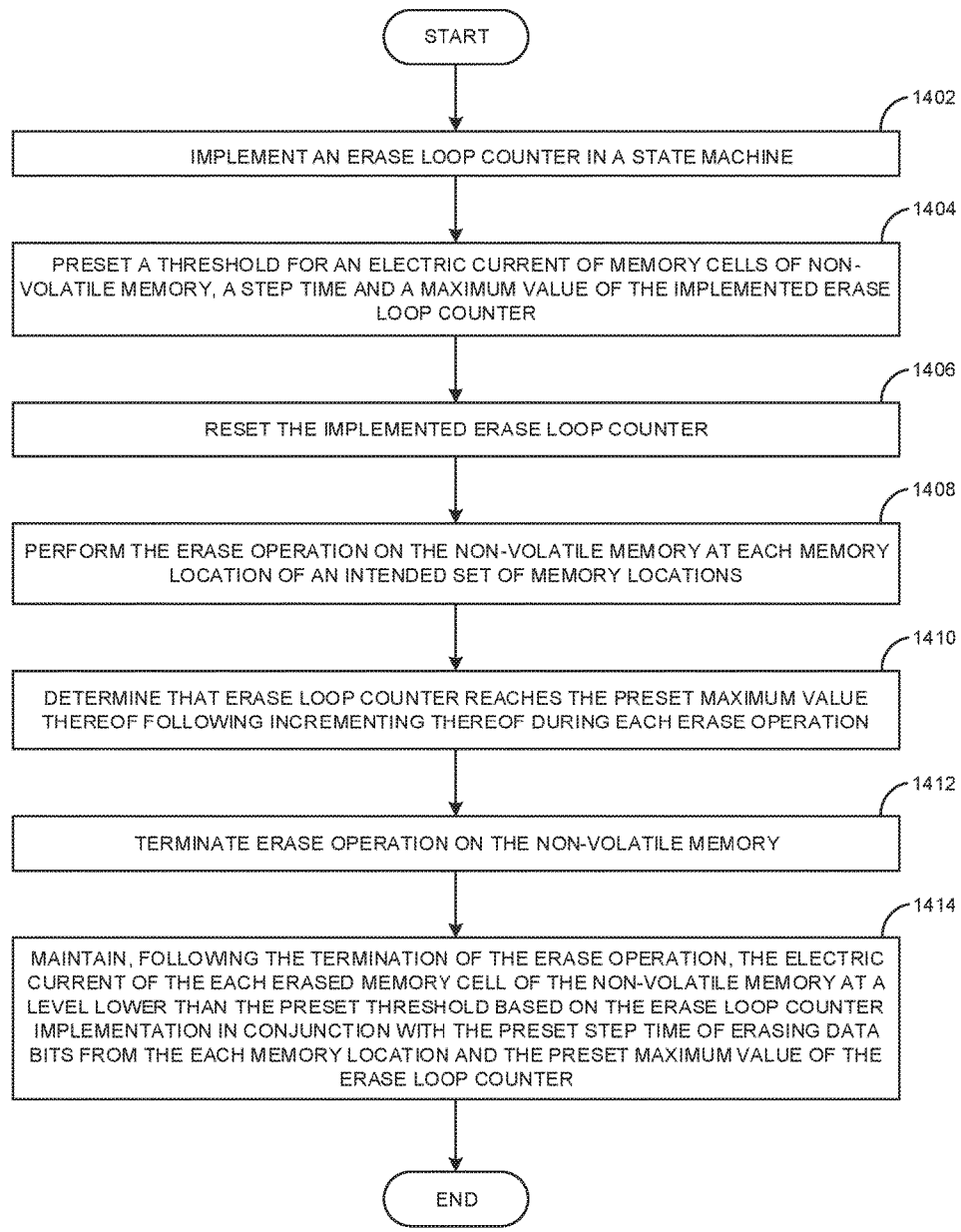
FIG. 14 is a process flow diagram detailing the operations involved in the state machine of the non-volatile memory system of FIG. 2 executing a sequence of instructions therethrough related to an erase operation performed on a non-volatile memory thereof, according to one or more embodiments.

FIG. 14 shows a process flow diagram detailing the operations involved in a method of state machine 220 configured to execute a sequence of instructions therethrough related to an erase operation performed on a non-volatile memory (e.g., memory array 212), according to one or more embodiments. In one or more embodiments, operation 1402 may involve implementing an erase loop counter (e.g., ERS_CNT 1056). In one or more embodiments, operation 1404 may involve presetting a threshold (e.g., $I_{ER}$) for an electric current of memory cells of the non-volatile memory, a step time (e.g., 5 ms) and a maximum value (e.g., ERS_CNT_MAX 1058) of the erase loop counter. In one or more embodiments, operation 1406 may involve resetting the implemented erase loop counter.

In one or more embodiments, operation 1408 may involve performing the erase operation on the non-volatile memory at each memory location of an intended set of memory locations. In one or more embodiments, the sub-operations of operation 1408 may involve reading data bits from the each memory location based on addressing thereof, determining that the read data bits from the each memory location addressed does not match a data work solely including bits with polarity equal to 0 or 1, generating an erase pulse (e.g., ERPulse) to erase the read data bits of the non-volatile memory at the each memory location addressed for the preset step time following the determination of the mismatch between the read data bits and the data word solely including bits with polarity equal to 0 or 1, and incrementing the erase loop counter following the generation of the erase pulse related to the erasure of the read data bits of the each memory location addressed.

In one or more embodiments, operation 1410 may involve determining that the incremented erase loop counter reaches the preset maximum value thereof. In one or more embodiments, operation 1412 may involve terminating the erase operation on the non-volatile memory based on the determination that the erase loop counter has reached the preset maximum value thereof. In one or more embodiments, operation 1414 may then involve maintaining, following the termination of the erase operation, the electric current of the each erased memory cell of the non-volatile memory at a level lower than the preset threshold based on the erase loop counter implementation in conjunction with the preset step time of erasing the read data bits from the each memory location addressed and the preset maximum value of the erase loop counter.

It should be noted that all currents, bit polarities and CLK edge triggering discussed above are merely for illustrative purposes and that alternate implementations are within the scope of the exemplary embodiments discussed herein.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware circuitry (e.g., CMOS based logic circuitry), firmware, software or any combination of hardware, firmware, and software (e.g., embodied in a non-transitory machine-readable medium). For example, the various electrical structures and methods may be embodied using transistors, logic gates, and electrical circuits (e.g., application specific integrated (ASIC) circuitry and/or Digital Signal Processor (DSP) circuitry).

In addition, it will be appreciated that the various operations, processes, and methods disclosed herein may be embodied in a machine-readable medium and/or a machine accessible medium compatible with a data processing system (e.g., processor 1202 and/or memory controller 1204 implementing state machine 220). Accordingly, the specification and drawings are to be regarded in an illustrative rather than a restrictive sense.

What is claimed is:

1. A method of a state machine configured to execute a sequence of instructions therethrough related to a program operation performed on a non-volatile memory, comprising:
  implementing a program loop counter in the state machine;

presetting a threshold for an electric current of memory cells of the non-volatile memory, a step time and a maximum value of the implemented program loop counter;

resetting the implemented program loop counter;

programming the non-volatile memory at each memory location of an intended set of memory locations, the programming at the each memory location of the intended set comprising:

reading data from the each memory location based on addressing thereof;

determining that the read data from the each memory location addressed does not match data to be programmed thereto;

generating a program pulse to program the non-volatile memory at the each memory location addressed for the preset step time following the determination of the mismatch between the read data and the data to be programmed; and incrementing the program loop counter following the generation of the program pulse related to the programming of the each memory location addressed;

determining that the incremented program loop counter reaches the preset maximum value thereof;

terminating the program operation on the non-volatile memory based on the determination that the program loop counter has reached the preset maximum value thereof; and maintaining, following the termination of the program operation, the electric current of the each programmed memory cell of the non-volatile memory at a level higher than the preset threshold based on the program loop counter implementation in conjunction with the preset step time of programming the each memory location addressed and the preset maximum value of the program loop counter.

2. The method of claim 1, further comprising:

presetting another threshold for the electric current of the memory cells of the non-volatile memory; and maintaining, following an erase operation on the memory cells of the non-volatile memory, the electric current of the each memory cell at a level lower than the preset another threshold.

3. The method of claim 2, further comprising maintaining, based on the maintenance of the electric current in a programmed state of the memory cells at the level higher than the preset threshold and the maintenance of the electric current in an erased state of the memory cells at the level lower than the preset another threshold, a width of a current sense window of a sense amplifier block of the non-volatile memory at a desired level thereof.

4. The method of claim 1, comprising implementing the state machine with a sequencer and a set of control registers.

5. The method of claim 4, comprising implementing the sequencer with pulse generator circuitry and at least one of: logic gates and flip-flops.

6. The method of claim 4, comprising:

implementing the program loop counter as a bit counter in the set of control registers; and implementing the maximum value of the program loop counter as a register in the set of control registers.

7. The method of claim 1, comprising implementing the state machine through at least one of: a processor and a memory controller of the non-volatile memory.

8. A method of a state machine configured to execute a sequence of instructions therethrough related to an erase operation performed on a non-volatile memory, comprising:

implementing an erase loop counter in the state machine;

presetting a threshold for an electric current of memory cells of the non-volatile memory, a step time and a maximum value of the implemented erase loop counter;

resetting the implemented erase loop counter;

performing the erase operation on the non-volatile memory at each memory location of an intended set of memory locations, the erase operation at the each memory location of the intended set comprising:

reading data bits from the each memory location based on addressing thereof;

determining that the read data bits from the each memory location addressed does not match a data word solely comprising bits with polarity equal to one of: 0 and 1;

generating an erase pulse to erase the read data bits of the non-volatile memory at the each memory location addressed for the preset step time following the determination of the mismatch between the read data bits and the data word solely comprising bits with the polarity equal to the one of: 0 and 1; and incrementing the erase loop counter following the generation of the erase pulse related to the erasure of the read data bits of the each memory location addressed;

determining that the incremented erase loop counter reaches the preset maximum value thereof;

terminating the erase operation on the non-volatile memory based on the determination that the erase loop counter has reached the preset maximum value thereof; and maintaining, following the termination of the erase operation, the electric current of the each erased memory cell of the non-volatile memory at a level lower than the preset threshold based on the erase loop counter implementation in conjunction with the preset step time of erasing the read data bits from the each memory location addressed and the preset maximum value of the erase loop counter.

9. The method of claim 8, further comprising:

presetting another threshold for the electric current of the memory cells of the non-volatile memory; and maintaining, following a program operation on the memory cells of the non-volatile memory, the electric current of the each memory cell at a level higher than the preset another threshold.

10. The method of claim 9, further comprising maintaining, based on the maintenance of the electric current in an erased state of the memory cells at the level lower than the preset threshold and the maintenance of the electric current in a programmed state of the memory cells at the level higher than the preset another threshold, a width of a current sense window of a sense amplifier block of the non-volatile memory at a desired level thereof.

11. The method of claim 8, comprising implementing the state machine with a sequencer and a set of control registers.

12. The method of claim 11, comprising implementing the sequencer with pulse generator circuitry and at least one of: logic gates and flip-flops.

13. The method of claim 11, comprising:

implementing the erase loop counter as a bit counter in the set of control registers; and implementing the maximum value of the erase loop counter as a register in the set of control registers.

14. The method of claim 8, comprising implementing the state machine through at least one of: a processor and a memory controller of the non-volatile memory.

15. A system comprising:

a non-volatile memory comprising memory cells; and a state machine communicatively coupled to the non-volatile memory, the state machine being configured to execute a sequence of instructions therethrough related to at least one of: a program operation and an erase operation performed on the non-volatile memory, wherein, based on the execution of the sequence of instructions during the program operation, the state machine is further configured to:

implement a program loop counter therein, preset a first threshold for an electric current of the memory cells of the non-volatile memory, a first step time and a maximum value of the implemented program loop counter, reset the implemented program loop counter, program the non-volatile memory at each memory location of an intended set of memory locations, the programming at the each memory location of the intended set comprising:

reading data from the each memory location based on addressing thereof, determining that the read data from the each memory location addressed does not match data to be programmed thereto, generating a program pulse to program the non-volatile memory at the each memory location addressed for the preset first step time following the determination of the mismatch between the read data and the data to be programmed, and incrementing the program loop counter following the generation of the program pulse related to the programming of the each memory location addressed, determine that the incremented program loop counter reaches the preset maximum value thereof, terminate the program operation on the non-volatile memory based on the determination that the program loop counter has reached the preset maximum value thereof, and maintain, following the termination of the program operation, the electric current of the each programmed memory cell of the non-volatile memory at a level higher than the preset first threshold based on the program loop counter implementation in conjunction with the preset first step time of programming the each memory location addressed and the preset maximum value of the program loop counter, and wherein, based on the execution of the sequence of instructions during the erase operation, the state machine is further configured to:

implement an erase loop counter therein, preset a second threshold for the electric current of the memory cells of the non-volatile memory, a second step time and a maximum value of the implemented erase loop counter, reset the implemented erase loop counter, perform the erase operation on the non-volatile memory at the each memory location of the intended set of memory locations, the erase operation at the each memory location of the intended set comprising:

reading data bits from the each memory location based on the addressing thereof, determining that the read data bits from the each memory location addressed does not match a data word solely comprising bits with polarity equal to one of: 0 and 1, generating an erase pulse to erase the read data bits of the non-volatile memory at the each memory location addressed for the preset second step time following the determination of the mismatch between the read data bits and the data word solely comprising bits with the polarity equal to the one of: 0 and 1, and incrementing the erase loop counter following the generation of the erase pulse related to the erasure of the read data bits of the each memory location addressed, determine that the incremented erase loop counter reaches the preset maximum value thereof, terminate the erase operation on the non-volatile memory based on the determination that the erase loop counter has reached the preset maximum value thereof, and maintain, following the termination of the erase operation, the electric current of the each erased memory cell of the non-volatile memory at a level lower than the preset second threshold based on the erase loop counter implementation in conjunction with the preset second step time of erasing the read data bits from the each memory location addressed and the preset maximum value of the erase loop counter.

16. The system of claim 15, further comprising a sense amplifier block communicatively coupled to the non-volatile memory, wherein the state machine is further configured to maintain a width of a current sense window of the sense amplifier block at a desired level thereof based on the maintenance of the electric current in a programmed state of the memory cells at the level higher than the preset first threshold and the maintenance of the electric current in an erased state of the memory cells at the level lower than the preset second threshold.

17. The system of claim 15, wherein the state machine is implemented with a sequencer and a set of control registers.

18. The system of claim 17, wherein the sequencer is implemented with pulse generator circuitry and at least one of: logic gates and flip-flops.

19. The system of claim 17, wherein at least one of:

the program loop counter is implemented as a bit counter in the set of control registers, and the maximum value of the program loop counter is implemented as a register in the set of control registers, and the erase loop counter is also implemented as a bit counter in the set of control registers, and the maximum value of the erase loop counter is also implemented as a register in the set of control registers.

20. The system of claim 15, wherein the state machine is implemented through at least one of: a processor and a memory controller of the non-volatile memory.

21. The system of claim 15, wherein each memory cell of the non-volatile memory comprises a floating poly-silicon gate and a single layer of poly-silicon.

* * * * *